United States Patent [19]

Ditchek

[11] Patent Number: 4,724,223

[45] Date of Patent: Feb. 9, 1988

[54] METHOD OF MAKING ELECTRICAL CONTACTS

[75] Inventor: Brian M. Ditchek, Milford, Mass.

[73] Assignee: GTE Laboratories Incorporated, Waltham, Mass.

[21] Appl. No.: 940,700

[22] Filed: Dec. 11, 1986

[51] Int. Cl.$^4$ ............................................. H01L 21/283
[52] U.S. Cl. ..................................... 437/200; 437/178; 357/67; 357/22
[58] Field of Search ........................... 29/590, 591, 589; 357/45, 67, 22; 148/DIG. 147; 427/88, 89

[56] References Cited

U.S. PATENT DOCUMENTS 3,889,359  6/1975  Rand ....................................... 29/578
4,463,366  7/1984  Ishii et al. ............................... 357/22
4,482,907 11/1984  Jay .......................................... 357/22

OTHER PUBLICATIONS

M. Tabasky et al., Materials Research Society Symposium Proceedings, vol. 52, eds. T. O. Sedgwick et al., pp. 271-277, 1985.
B. M. Ditchek, J. Appl. Phys., 57(6), Mar. 15, 1985, pp. 1961-1967, "Preparation and Electrical Properties of a Directionally Solidified . . . ".
B. M. Ditchek, Journal of Crystal Growth, 75 (1986), pp. 264-268, "Bridgman and Czochralski Growth . . . ".
S. P. Murarka, J. Vac. Sci. Technol., vol. 17, No. 4, Jul./Aug., 1980, pp. 775-792, "Refractory Silicides for . . . ".

Primary Examiner—Brian E. Hearn
Assistant Examiner—Tuan N. Quach
Attorney, Agent, or Firm—David M. Keay

[57] ABSTRACT

Electrical contacts are made to conductive elements of an array which are embedded in a matrix of silicon with the conductive elements exposed at a surface. The surface is covered with silicon oxide, and an opening is made in the silicon oxide to expose a portion of the matrix and a portion of each of several conductive elements. A silicide-forming metal, for example cobalt, is deposited, the assemblage is heated to cause the cobalt to react with the exposed silicon to form conductive cobalt disilicide. The cobalt disilicide is in ohmic contact with each of the conductive elements at the interfaces therewith and is in rectifying contact with the silicon of the matrix at the interface therewith. Unreacted cobalt overlying the silicon oxide is removed.

7 Claims, 8 Drawing Figures

METHOD OF MAKING ELECTRICAL CONTACTS

This invention was made with Government support under Contract No. F49620-86-C-0034 awarded by the Department of the Air Force. The Government has certain rights in this invention.

CROSS-REFERENCE TO RELATED APPLICATIONS

The subject matter of this application is related to application Ser. No. 940,371 and application Ser. No. 941,478 filed concurrently herewith.

BACKGROUND OF THE INVENTION

This invention relates to semiconductor devices. More particularly, it is concerned with methods of making electrical contact to elements of semiconductor devices.

In conventional planar semiconductor device technology the flow of current between the source and drain electrodes of a field effect transistor (FET) is controlled by applying a gate voltage to its gate electrode. The gate voltage increases or decreases the width of the depletion layer of the gate region between the source and the drain, and thus alters the effective resistance of the device. That is, an FET is basically a voltage-controlled resistor. In order to reduce significantly the current passing between the source and the drain, the gate voltage should be able to increase the width of the depletion layer to a dimension comparable to the total width of the current path. Thus, for practical purposes, the current channel of an FET fabricated by conventional planar technology is limited to about 1 to 10 micrometers. These physical limitations of the device elements limit the amount of current which can be controlled.

An improved FET capable of handling larger amounts of current as described and claimed in application Ser. No. 941,478 filed concurrently herewith includes a matrix of semiconductor material having an array of individual rods of conductive material disposed therein. The rods serve as control or gate elements in the FET. In order to provide biasing potential to the rods electrical contacts must be made to the rods without producing short-circuits to the semiconductor matrix.

SUMMARY OF THE INVENTION

The method in accordance with the present invention for making electrical contact to conductive elements embedded in a matrix of semiconductor material comprises providing a body including a matrix of semiconductor material having disposed therein an array of individual conductive elements exposed at a surface of the body. A coating of an insulating protective material having an opening exposing a portion of the matrix and a portion of each of the conductive elements of a plurality of conductive elements is formed on the surface of the body. A layer of a metal capable of forming a conductive compound with the semiconductor material is deposited over the coating and the exposed portion of the matrix and conductive elements. The assemblage is heated to cause the metal to react with the semiconductor material of the matrix at the exposed portion thereof and form a conductive compound of the metal and semiconductor material. The conductive compound forms ohmic contacts with the conductive elements at the interface therewith, and forms a rectifying barrier with the semiconductor material of the matrix at the interface therewith. The metal does not react with the coating of insulating material, and is removed from the coating.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the above-described drawings.

DETAILED DESCRIPTION

In fabricating devices, a charge containing the constituents of a eutectic composition of a semiconductor material and a conductive material is prepared. Any of several eutectic systems may be utilized in which the semiconductor phase is the matrix phase and the conductive material is the minor phase. These systems may be, for the example, of the form $Ge-MGe_2$, $Si-MSi_2$, and $GaAs-MAs$, where M is a metal. A charge containing the constituents in proper proportions to the eutectic composition of the semiconductor material and the conductive compound is melted in a suitable crucible and solidified unidirectionally.

More specifically, a Czochralski crystal growth technique is employed in which a single crystal seed of the semiconductor material is lowered into contact with the molten surface of the charge, and the seed is pulled upward. A boule consisting of a composite of the semiconductor material and the conductive material that forms a eutectic with the semiconductor material is produced in which the semiconductor material is in the form of a single crystal matrix with rods of the conductive material disposed in the matrix. The matrix of semiconductor material is of the same crystal orientation as the seed crystal and the rods extend generally parallel to the direction of pulling.

Figure 1:
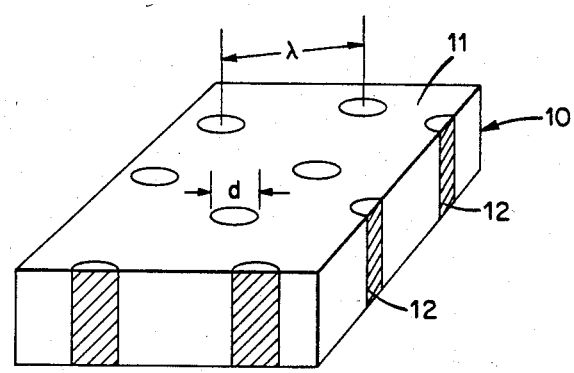
FIG. 1 is a schematic representation of a perspective view taken in cross-section of a fragment of a body which includes a matrix of semiconductor material having conductive rods disposed therein.

FIG. 1 illustrates a fragment of a section or a body 10 cut from a boule grown as above. The body consists essentially of a matrix of semiconductor material 11 and an array of rods 12 of the conductive material which forms the eutectic composition with the semiconductor material. As illustrated in FIG. 1, the upper and lower major surfaces of the body 10 are a result of cutting the boule transverse to the direction of pulling of the seed crystal. The side surfaces are formed by cuts parallel to the rods 12. Each rod 12 extends perpendicularly from the upper major surfaces to the lower major surface.

The rods 12 are not necessarily of perfect circular cross-section nor are they necessarily perfectly parallel. The rods 12 are, however, each individual elements and do not interconnect, and the semiconductor matrix 11 is entirely interconnected and surrounds each of the individual rods.

The semiconductor material of the melt is appropriately doped with conductivity type imparting material of either N or P-type so that Schottky barriers are formed between the conductive rods 12 and the semiconductor matrix 11. The carrier concentration in the semiconductor material is from $10^{14}$ to $10^{16}$ cm$^{-3}$. The volume fraction of the rods 12 in the body 10 should be between 0.5% and 35%. The inter-rod spacing of a composite formed by eutectic solidification is given by $\lambda^2 v =$ constant, where is the average inter-rod spacing, v is the growth rate, and the constant is a characteristic of the particular eutectic system. The rod diameter (d) is related to the inter-rod spacing ($\lambda$) by the volume fraction of the rods as determined by the eutectic phase diagram of the particular eutectic system. For suitable device structures the inter-rod spacing ($\lambda$) should be between 1 and 50 micrometers, and the rod diameter (d) should be between 0.1 and 15 micrometers.

FIGS. 2A-2E illustrate stages in the fabrication of a device from a body 10 as illustrated in FIG. 1 of a matrix 11 of semiconductor material having disposed therein an array of conductive rods 12. For purposes of discussion the semiconductor matrix 11 is of single crystal silicon with conductive rods 12 of tantalum silicide (TaSi$_2$) grown from a Si-TaSi$_2$ eutectic composition. Examples of other suitable Si-silicide eutectic systems are Si-tungsten silicide, Si-niobium silicide, Si-zirconium silicide, and Si-chromium silicide.

Figure 2A:
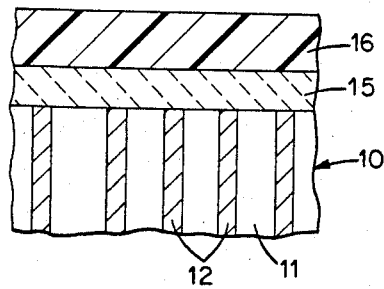
FIGS. 2A-2E are elevational views in cross-section illustrating various stages in the process of fabricating a semiconductor device and electrical contact in accordance with the present invention.
Figure 2B:
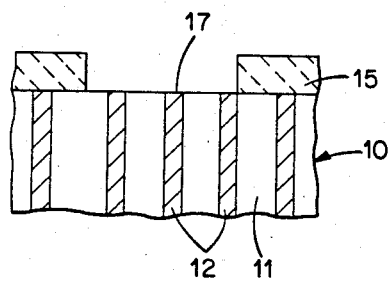

After suitable polishing of the surfaces of the body 10 to remove surface damage, the body is treated in wet oxygen to form an adherent layer of silicon oxide 15 on the upper major surface as illustrated in FIG. 2A. A standard photoresist material 16 is deposited on the silicon oxide coating 15. By employing known photolithographic masking and etching techniques an opening is formed in the photoresist layer 16 and then an opening 17 is etched in the oxide layer 15. The photoresist material is then removed. As illustrated in FIG. 2B the end surfaces of several of the conductive rods 12 encircled by the silicon matrix 11 are exposed at the uncovered area of the upper major surface.

Figure 2C:
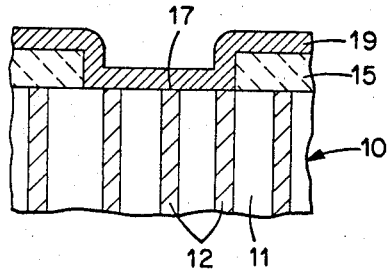
Figure 2D:
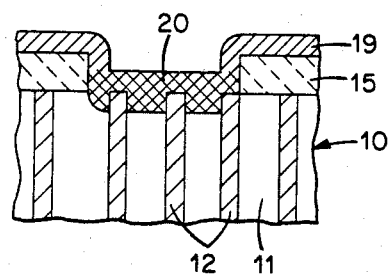

A film 19 of a suitable metal which forms a conductive compound with silicon, specifically cobalt, is deposited over the layer of silicon oxide 15 and also over the surface of the body at the opening 17 as illustrated in FIG. 2C. The body is then subjected to a rapid thermal annealing treatment by heating at a temperature of about 800° C. for about 12 seconds to cause the cobalt in contact with silicon to react and form a conductive member 20 of cobalt disilicide as illustrated in FIG. 2D. The cobalt over the silicon oxide does not react and remains as cobalt. This unreacted cobalt is removed by a suitable chemical etch which attacks the cobalt but does not significantly affect the cobalt disilicide.

Figure 2E:
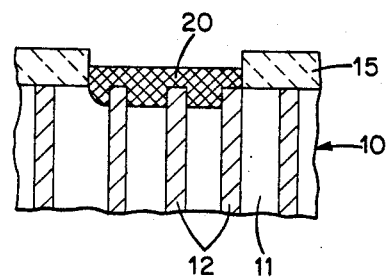

In the resulting structure as illustrated in FIG. 2E the cobalt disilicide contact member 20 forms an ohmic contact with the ends of several of the TaSi$_2$ rods 12. The interface of the cobalt disilicide contact member 20 with the silicon of the matrix 11 is a Schottky rectifying barrier. The rectifying barrier formed between the contact member 20 and the semiconductor matrix 11 should have a barrier potential which is equal to or higher than the barrier potential of the rectifying barrier between the conductive rods 12 and the semiconductor matrix 11. Platinum silicide has a high potential barrier with N-type silicon and yttrium silicide has a high potential barrier with P-type silicide. Other silicide-forming metals which may be used include nickel, titanium, tantalum, tungsten, and molybdenum.

Figure 3:
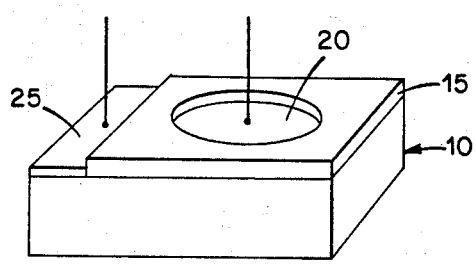
FIG. 3 is a schematic representation in perspective of a diode fabricated by employing the present invention.

FIG. 3 illustrates a two electrode, or diode, device fabricated from the structure as illustrated in FIG. 2E. Silicon oxide 15 is removed from a portion of the major surface of the body 10 and an ohmic contact 25, for example of gold doped with antimony for N-type silicon, is applied.

Figure 4:
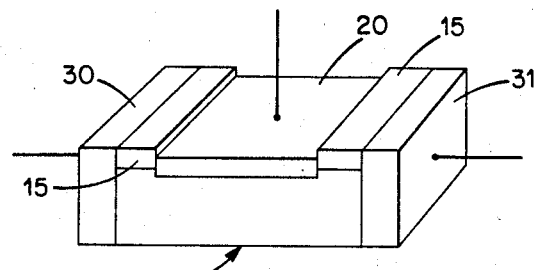
FIG. 4 is a schematic representation in perspective of an FET fabricated by employing the present invention.

FIG. 4 illustrates an FET fabricated from the structure as illustrated in FIG. 2E. The contact member 20 in ohmic contact with several rods serves as the gate contact member. Ohmic contacts 30 and 31 are made to opposite side surfaces of the body 10 to serve as source and drain contact members, respectively. Current from the source contact 30 to the drain contact 31 flows through the channel region of the silicon matrix which underlies the gate contact member 20. The channel region is interspersed with the conductive rods which contact the gate contact 20. Since the interfaces between the rods and the silicon matrix are Schottky rectifying junctions, a depletion zone is produced in the silicon adjacent to each of the rods by biasing potential applied to the gate contact 20. Each depletion zone extends from the interface of the rod with the matrix laterally outward into the matrix. Due to the lack of mobile current carriers in these zones, they have a very high resistance relative to the resistance of the normally-doped silicon of the matrix. Thus, the effective channel for current flow is determined by the spacing between the depletion zones.

The size of the depletion zones is determined primarily by the carrier concentration in the silicon and the magnitude of the bias voltage applied to the gate contact 20. The carrier concentration of the silicon of the matrix is designed such that without a bias voltage applied to the conductive rods, the depletion zones are small, consuming a sufficiently small volume of the channel region so as to have little or no effect on the resistivity of the composite and thus of current flow from the source to the drain. The growth rate (v) at which the composite is pulled from the molten charge is chosen to produce inter-rod spacing ($\lambda$) such that the application of a suitable reverse bias voltage to the rods is sufficient to enlarge the depletion zones around the rods such that the depletion zones extend across the channel. The channel is thereby closed, effectively "pinching off" current flow between the source and drain and switching the device off.

A significant distinction between an FET as described and a conventional planar FET is the magnitude of the channel. In the eutectic composites as discussed hereinabove the rods are continuous from the top surface to the bottom surface of the body. Thus, the rectifying junctions extend through the entire thickness of the body producing a three-dimensional volume of semiconductor material to be controlled rather than, in effect, a two-dimensional channel as in a conventional planar FET. Since the thickness of the composite body may be orders of magnitude greater than the channel of a conventional planar FET, it is capable of switching currents which are orders of magnitude greater.

As an example of devices produced in accordance with the invention, Si-TaSi$_2$ eutectic composites were grown directly from a melt in a Czochralski crystal growth furnace in accordance with Czochralski crystal growth techniques. A charge of silicon and tantalum was placed in a quartz crucible with a graphite susceptor. The tantalum was 5.5% by weight of the charge, providing the mole ratio of silicon to tantalum in the Si-TaSi$_2$ eutectic composition. The charge was doped with phosphorus. After rf heating the charge to above the eutectic temperature and obtaining charge homogenization, a (111) orientation silicon seed was lowered onto the melt surface. Composite boules were pulled from the melt at a growth rate (v) of 20 cm/h in a flowing argon atmosphere. The resulting boule was approximately 2.5 cm in diameter and 12 cm in length. The silicon matrix phase was of single crystal (111) orientation and was free of grain boundaries. The boule was 2% by volume of conductive, metallic, TaSi$_2$ rods. At a transverse-cut major surface the composite contained $1.6 \times 10^6$ TaSi$_2$ rods/cm$^2$ with an average rod diameter (d) of 1.2 micrometers. The average inter-rod spacing ($\lambda$) was 7.9 micrometers. The carrier concentration in the silicon matrix as determined by Hall measurements varied from $1.1 \times 10^{15}$ cm$^{-3}$ at one end of the boule to $1.8 \times 10^{15}$ cm$^{-3}$ at the opposite end. The electron mobility in the matrix was approximately 925 cm$^2$/V-sec.

Diodes were fabricated from 500 micrometer thick slices of the boule. The slices were polished using colloidal silica to remove damaged surface material. A 0.2 micrometer thick silicon oxide coating was grown on the surfaces. The silicon oxide coating was covered with a photoresist layer, and using standard photolithographic and etching techniques 127 micrometer diameter openings were made in the oxide coating. The photoresist was removed, and a layer of cobalt 700 angstroms thick was deposited over the silicon oxide layer and the exposed surfaces of the slice at the openings in the silicon oxide layer. The slice was treated by rapid thermal annealing at a temperature of 800° C. for 12 seconds. As explained hereinabove, the cobalt reacted with the exposed silicon at the openings in the silicon oxide coating to form cobalt disilicide contacts. The unreacted cobalt overlying the silicon oxide was removed by etchings in an HNO$_3$ solution The cobalt disilicide provided ohmic metallic contacts to the exposed ends of the TaSi$_2$ rods while forming Schottky barriers with the silicon of the matrix. The Schottky barriers between the cobalt disilicide and the silicon have a higher barrier potential than the Schottky barriers between the TaSi$_2$ rods and silicon. An ohmic contact was formed adjacent to the edge of the body of each device by etching away silicon oxide and then depositing and alloying a gold-antimony film.

Based on the area of the cobalt disilicide contact member and the rod density, the effective region of a diode device contains 190 rods. For a 500 micrometer thick device the total junction area is $3.6 \times 10^{-3}$ cm$^2$. This area is approximately thirty times the area of contact of the cobalt disilicide member to the silicon matrix. Since cobalt disilicide provides a slightly higher Schottky barrier to silicon than does tantalum disilicide (0.64 eV versus 0.59 eV) the contribution of the cobalt disilicide-silicon junction to the current-voltage and capacitance-voltage characteristics is negligible.

The current-voltage and capacitance-voltage characteristics of the diodes were analyzed. The diodes were ideally low in leakage and the breakdown voltage exceeded 10 volt. Breakdown was "soft" and occurred at about 30 volts. Analysis of the current-voltage characteristics based on the Si-TaSi$_2$ junction area indicated a Schottky barrier potential of 0.62 eV. The ideality factor of the device was nearly ideal and comparable to conventional planar diodes. The capacitance-voltage analysis indicated that the junctions operated like cylindrical junctions, as opposed to planar junctions. The capacitance values verify that the entire junction area was contributing to the capacitance.

Electron beam induced current (EBIC) techniques were also used to study the junctions and the eutectic composite. The results indicated that with a 10 volt reverse bias gate voltage, a value much less than the breakdown voltage, the depletion zone around each rod can be enlarged from 0.8 micrometers to 2.5 micrometers. At 2.5 micrometers the depletion zone volume fraction of the composite is 45%, nearly enough to cause "pinch off." Resistivity measurements indicate that increasing the volume fraction of depleted material from 5% to 10% is sufficient to increase the resistivity of the device by a factor of 7. The EBIC measurement technique also verified that the rods extend completely through slices 1270 micrometers thick.

Thus, devices can be fabricated from eutectic composites produced by employing Czochralski techniques to directionally solidify a semiconductor material and a conductive compound of the semiconductor material and a metal which form a suitable eutectic composition. A three-dimensional or bulk structure is thus provided for the fabrication of an FET in which the gate structure is an array of Schottky barriers with the bulk semiconductor material. Such a device is capable of controlling large amounts of current.

While there has been shown and described what are considered preferred embodiments of the present invention, it will be obvious to those skilled in the art that various changes and modifications may be made therein without departing from the invention as defined by the appended claims.

What is claimed is:

1. The method of making electrical contact to conductive elements embedded in a matrix of silicon comprising providing a body including a matrix of silicon having disposed therein an array of individual conductive elements exposed at a surface of the body;

forming an adherent, protective layer of silicon oxide on said surface of the body having an opening exposing a portion of said matrix of silicon and a portion of each of the conductive elements of a plurality of said conductive elements;

depositing a layer of a silicide-forming metal over said layer of silicon oxide and the exposed portions of the matrix and conductive elements;

heating to cause the silicide-forming metal to react with the silicon of the matrix at said exposed portion thereof to form a conductive metal silicide, said conductive metal silicide being in ohmic contact with said conductive elements at the interfaces therewith and being in rectifying contact with the silicon of said matrix at the interface therewith, the silicide-forming metal not reacting with the underlying silicon oxide of said layer; and removing the unreacted silicide-forming metal overlying the layer of silicon oxide.

2. The method in accordance with claim 1 wherein said silicide-forming metal is selected from the group consisting of cobalt, platinum, yttrium, nickel, titanium, tantalum, tungsten, and molybdenum.

3. The method in accordance with claim 2 wherein said conductive elements are an array of individual rods of conductive material forming rectifying barriers at the interfaces of the rods and the silicon, said rods being disposed generally parallel to each other and transverse to said surface of the body with one end of each of the rods of said plurality being exposed at said surface.

4. The method in accordance with claim 3 wherein the conductive material of the rods is a conductive compound of a second metal and silicon.

5. The method in accordance with claim 4 wherein the volume fraction of the array of rods of the conductive compound of the second metal in the body is from 0.5 to 35 percent.

6. The method in accordance with claim 5 wherein the diameter of each of said rods is from 0.1 to 15 micrometers; and
the spacing between adjacent rods is from 1 to 50 micrometers.

7. The method in accordance with claim 6 wherein said silicide-forming metal is cobalt which reacts with the silicon to form cobalt disilicide.

* * * * *

UNITED STATES PATENT AND TRADEMARK OFFICE
CERTIFICATE OF CORRECTION

PATENT NO. : 4,724,223

DATED : February 9, 1988

INVENTOR(S) : Brian M. Ditchek

It is certified that error appears in the above—identified patent and that said Letters Patent is hereby corrected as shown below:

Column 1, line 8, after the first paragraph and before the heading "CROSS-REFERENCE TO RELATED APPLICATIONS" insert -- This invention was made with Government support under Contract N00014-86-C-0595 awarded by the Department of the Navy. The Government has certain rights in the invention. --

Signed and Sealed this

Twelfth Day of July, 1988

Attest:

DONALD J. QUIGG

Attesting Officer

Commissioner of Patents and Trademarks